(12) United States Patent
Kishimoto et al.

(10) Patent No.: US 12,268,095 B2
(45) Date of Patent: Apr. 1, 2025

(54) PIEZOELECTRIC DEVICE

(71) Applicant: Murata Manufacturing Co., Ltd., Nagaokakyo (JP)

(72) Inventors: Yutaka Kishimoto, Nagaokakyo (JP); Shinsuke Ikeuchi, Nagaokakyo (JP); Masayuki Suzuki, Nagaokakyo (JP); Fumiya Kurokawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 827 days.

(21) Appl. No.: 17/507,858

(22) Filed: Oct. 22, 2021

(65) Prior Publication Data

US 2022/0045262 A1 Feb. 10, 2022

Related U.S. Application Data

(63) Continuation of application No. PCT/JP2020/001645, filed on Jan. 20, 2020.

(30) Foreign Application Priority Data

May 17, 2019 (JP) ................................. 2019-094018

(51) Int. Cl.
*H01L 41/053* (2006.01)
*H10N 30/00* (2023.01)
(Continued)

(52) U.S. Cl.
CPC ......... *H10N 30/708* (2024.05); *H10N 30/082* (2023.02); *H10N 30/871* (2023.02); *H10N 30/877* (2023.02); *H10N 30/853* (2023.02)

(58) Field of Classification Search
CPC ... H10N 30/708; H10N 30/871; H10N 30/877
(Continued)

(56) References Cited

U.S. PATENT DOCUMENTS

| 9,055,372 B2 | 6/2015 | Grosh et al. | |
| 2008/0042524 A1* | 2/2008 | Shibata | H03H 9/105 |
| | | | 29/25.35 |

(Continued)

FOREIGN PATENT DOCUMENTS

| JP | 2013-515949 A | 5/2013 |
| JP | 2014-515214 A | 6/2014 |
| JP | 2017-032450 A | 2/2017 |

OTHER PUBLICATIONS

Official Communication issued in International Patent Application No. PCT/JP2020/001645, mailed on Mar. 24, 2020.

*Primary Examiner* — Derek J Rosenau
(74) *Attorney, Agent, or Firm* — Keating & Bennett, LLP (57) ABSTRACT

A piezoelectric device includes a base portion and an upper layer on an upper side of and supported by the base portion. The upper layer includes a membrane portion that does not overlap with the base portion in plan view. The membrane portion includes at least one piezoelectric layer sandwiched by electrode layers from a top and a bottom thereof. An intermediate layer is between a lower electrode and the base portion. The intermediate layer includes one or more individual layers, and an individual layer exposed as a lower surface of the membrane portion among the one or more individual layers includes a bent portion, which extends from the lower surface of the membrane portion to a lateral wall, on a boundary between a portion defining and functioning as the lower surface of the membrane portion and a portion overlapping with the base portion.

15 Claims, 9 Drawing Sheets

(51) Int. Cl.
   *H10N 30/082*   (2023.01)
   *H10N 30/87*    (2023.01)
   *H10N 30/853*   (2023.01)
(58) Field of Classification Search
   USPC .............................................. 310/324, 348
   See application file for complete search history.

(56) References Cited

U.S. PATENT DOCUMENTS

| | | |
|---|---|---|
| 2012/0053393 A1 | 3/2012 | Kaltenbacher et al. |
| 2012/0250909 A1 | 10/2012 | Grosh et al. |
| 2013/0015537 A1 | 1/2013 | Nowak et al. |
| 2019/0036003 A1* | 1/2019 | Xia ..................... H04R 17/02 |

* cited by examiner

PIEZOELECTRIC DEVICE

CROSS REFERENCE TO RELATED APPLICATIONS

This application claims the benefit of priority to Japanese Patent Application No. 2019-094018 filed on May 17, 2019 and is a Continuation Application of PCT Application No. PCT/JP2020/001645 filed on Jan. 20, 2020. The entire contents of each application are hereby incorporated herein by reference.

BACKGROUND OF THE INVENTION

1. Field of the Invention

The present invention relates to a piezoelectric device.

2. Description of the Related Art

A piezoelectric device including a membrane portion is known. Such a piezoelectric device is described in U.S. Pat. No. 9,055,372 and U.S. Patent Application Publication No. 2012/0053393, for example. Membrane portions have a square or circular shape, for example, when viewed from directly above and slits are radially formed from the center of the membrane portions. A V-shape portion formed by two slits is one beam, and beams vibrate when a piezoelectric layer operates.

When a layer is exposed as a lower surface of a membrane portion, an altered layer may be generated on this layer. Existence of such an altered layer may cause frequency variations among beams in one membrane portion.

SUMMARY OF THE INVENTION

Preferred embodiments of the present invention provide piezoelectric devices that each reduce or prevent problems caused by an altered layer.

A piezoelectric device according to a preferred embodiment of the present invention includes a base portion and an upper layer on an upper side of the base portion and supported by the base portion. The upper layer includes a membrane portion which does not overlap with the base portion in plan view. The membrane portion includes at least one piezoelectric layer that is sandwiched by electrode layers from a top and a bottom thereof. An intermediate layer is between an electrode layer and the base portion, the electrode layer being on a lower side of a lowest piezoelectric layer among the at least one piezoelectric layer. The intermediate layer includes one or more individual layers. An individual layer exposed as a lower surface of the membrane portion among the one or more individual layers includes a bent portion, the bent portion extending from the lower surface of the membrane portion to a lateral wall in a sectional view, on a boundary between a portion defining and functioning as the lower surface of the membrane portion and a portion overlapping with the base portion.

According to preferred embodiments of the present invention, problems caused by an altered layer are able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention are described in detail below with reference to the drawings.

The drawings do not always show actual dimensional ratios, and sometimes show an exaggerated dimensional ratio for the sake of convenience of description. Up or down directions described in the following description does not always mean absolute up or down, and sometimes means relative up or down in a posture illustrated in the drawings.

First Preferred Embodiment

Structure

Figure 1:
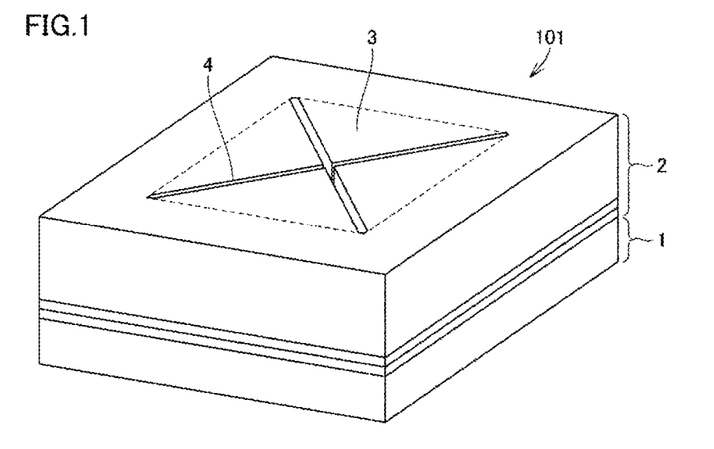
FIG. 1 is a perspective view of a piezoelectric device according to a first preferred embodiment of the present invention.
Figure 2:
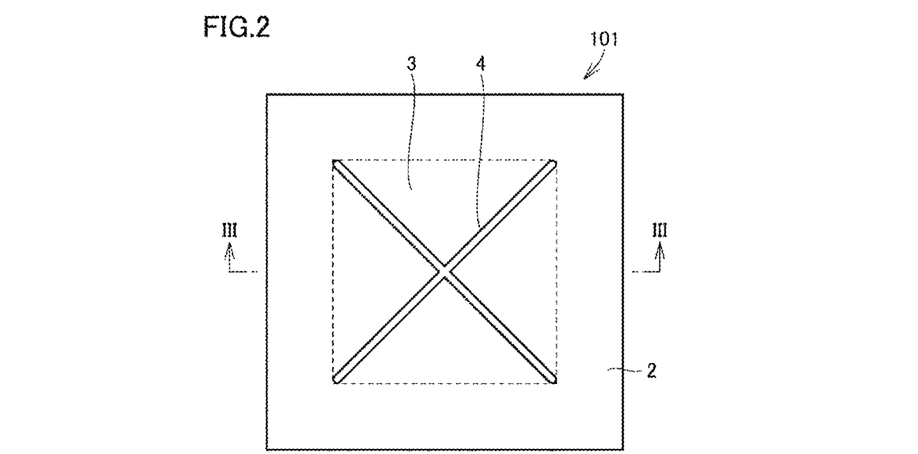
FIG. 2 is a plan view of the piezoelectric device according to the first preferred embodiment of the present invention.
Figure 3:
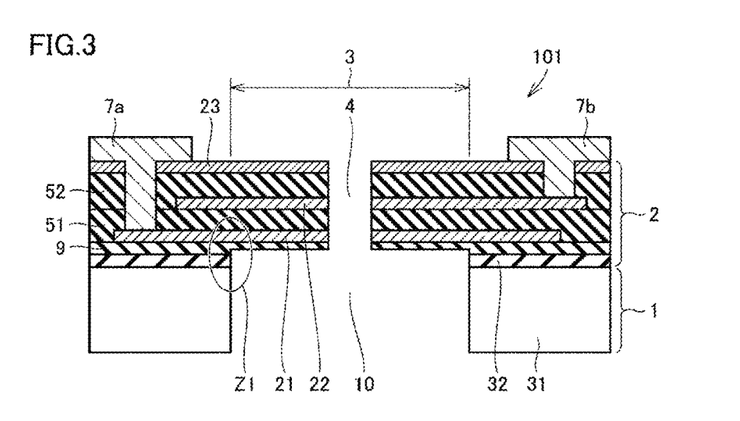
FIG. 3 is a sectional view taken along the line and viewed in an arrow direction of FIG. 2.
Figure 4:
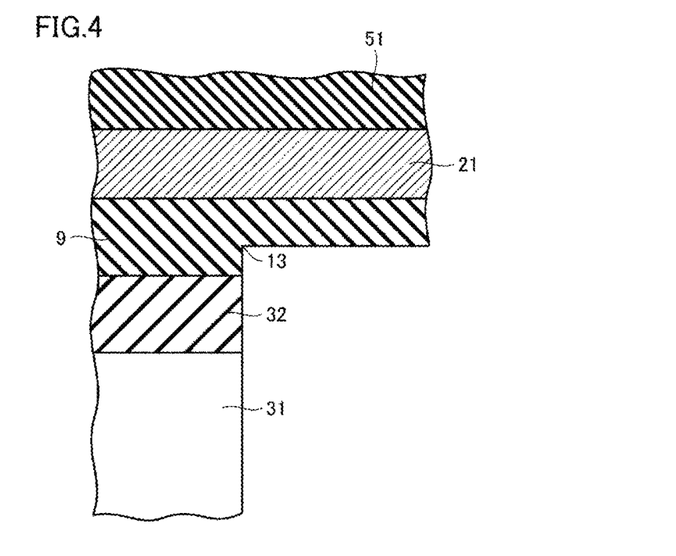
FIG. 4 is an enlarged view of a Z1 portion of FIG. 3.

A piezoelectric device according to a first preferred embodiment of the present invention will be described with reference to FIGS. 1 to 4. FIG. 1 is a perspective view of a piezoelectric device 101 according to the present embodiment. FIG. 2 is a plan view of the piezoelectric device 101. FIG. 3 is the sectional view taken along the line and viewed in the arrow direction of FIG. 2. FIG. 4 illustrates a Z1 portion of FIG. 3 in an enlarged manner.

The piezoelectric device 101 includes a base portion 1 and an upper layer 2 that is provided on the upper side of the base portion 1 and is supported by the base portion 1. The upper layer 2 includes a membrane portion 3 that is a region which does not overlap with the base portion 1 in plan view. As illustrated in FIG. 1 and FIG. 2, the membrane portion 3 is divided into a plurality of regions by a slit 4. The slit 4 has an X shape in the example described here. The slit 4 may be radially provided to divide the membrane portion 3 into more regions.

The membrane portion 3 includes at least one piezoelectric layer that is sandwiched by electrode layers from the top and the bottom thereof, as illustrated in FIG. 3. In the example described here, two piezoelectric layers 51 and 52 are laminated as "at least one piezoelectric layer". The piezoelectric layer 51 is sandwiched by a lower electrode 21 and an intermediate electrode 22 in at least a portion of a region thereof. The piezoelectric layer 52 is sandwiched by the intermediate electrode 22 and an upper electrode 23 in at least a portion of a region thereof. In the present preferred embodiment, the lowest piezoelectric layer among the "at least one piezoelectric layer" described above is the piezoelectric layer 51, and an intermediate layer is disposed between the electrode layer on the lower side of the piezoelectric layer 51 and the base portion 1. The "electrode layer on the lower side of the piezoelectric layer 51" is the lower electrode 21, in the present preferred embodiment. The intermediate layer between the lower electrode 21 and the base portion 1 is a seed layer 9.

This intermediate layer may include one or more individual layers, but the intermediate layer in the present preferred embodiment is a single layer which is the seed layer 9. An individual layer exposed as a lower surface of the membrane portion 3 among the one or more individual layers includes a bent portion 13 on a boundary between a portion defining and functioning as the lower surface of the membrane portion 3 and a portion overlapping with the base portion 1. The bent portion 13 extends from the lower surface of the membrane portion 3 to a lateral wall in the sectional view. As the intermediate layer is only a single layer which is the seed layer 9 in the present preferred embodiment, the seed layer 9 includes the bent portion 13 that extends from the lower surface of the membrane portion 3 to the lateral wall in the sectional view, as illustrated in FIG. 4. FIG. 4 illustrates the bent portion 13 as a point on which a vertical side and a horizontal side intersects each other in the sectional view, for the sake of convenience in description. However, the bent portion 13 is not limited to a point in the sectional view, and may be a region extending to some extent in practice. The bent portion 13 may be a portion having a round shape, for example.

Advantageous Effects

The individual layer exposed as the lower surface of the membrane portion 3 includes the bent portion 13 on the boundary between the portion defining and functioning as the lower surface of the membrane portion 3 and the portion overlapping with the base portion 1, in the present preferred embodiment. Accordingly, it can be said that an altered layer which originally existed on the lower surface of this individual layer is already removed, thus reducing or preventing an occurrence of problems which are caused by an altered layer and improving characteristics of the piezoelectric device. In the present preferred embodiment, an altered layer is already removed and accordingly, frequency variation among beams can be reduced or prevented.

In the present preferred embodiment, when the bent portion 13 is provided on the individual layer exposed as the lower surface of the membrane portion 3, an altered layer is removed. Further, a frequency of piezoelectric vibration can be easily adjusted by adjusting the removal depth in the formation of the bent portion 13.

In the present preferred embodiment, as the bent portion 13 is provided on the individual layer exposed as the lower surface of the membrane portion 3, interfacial peeling is less likely to occur.

Second Preferred Embodiment

Manufacturing Method

A non-limiting example of a method for manufacturing a piezoelectric device according to a second preferred embodiment of the present invention will be described with reference to FIG. 5 to FIG. 14. The piezoelectric device in the present preferred embodiment is a piezoelectric device 102 illustrated in FIG. 14. In order to produce the piezoelectric device 102, the manufacturing method described below, for example, may be applied.

Figure 5:
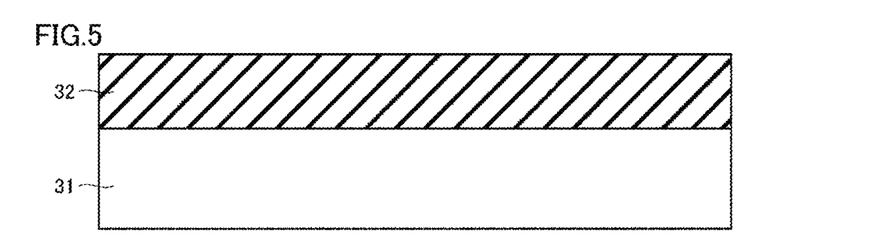
FIG. 5 is an explanation diagram of a first step in a method for manufacturing a piezoelectric device according to a second preferred embodiment of the present invention.
Figure 6:
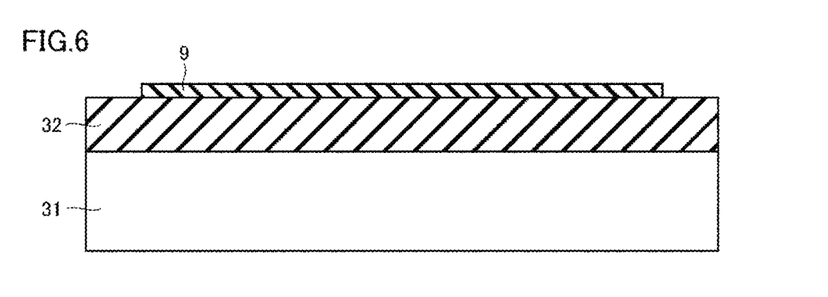
FIG. 6 is an explanation diagram of a second step in the method for manufacturing the piezoelectric device according to the second preferred embodiment of the present invention.

A $SiO_2$ layer 32 is first formed on a Si layer 31 as illustrated in FIG. 5. The seed layer 9 is formed on the $SiO_2$ layer 32 as illustrated in FIG. 6. The seed layer 9 can be formed with any material of AlN, ZnO, and PZT, for example. Layers made of these materials include an initial layer. The "initial layer" is an altered layer that is formed on a surface.

Figure 7:
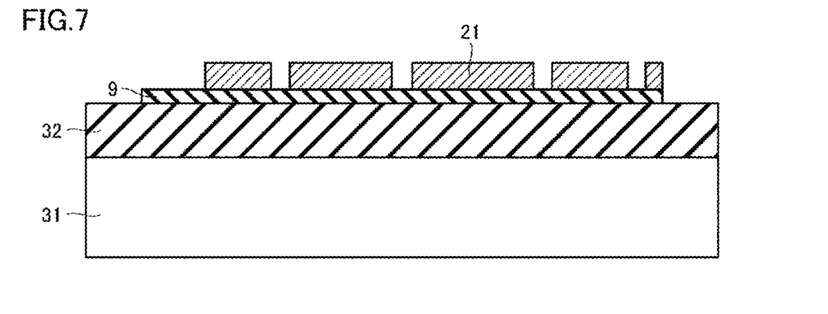
FIG. 7 is an explanation diagram of a third step in the method for manufacturing the piezoelectric device according to the second preferred embodiment of the present invention.

The lower electrode 21 is formed and patterned in a desired shape as illustrated in FIG. 7. This patterning may be performed such that a resist pattern is formed by photolithography and RIE is performed, for example. The lower electrode 21 can be formed with any material of Mo and W, for example. An adhesion layer may be formed in advance when forming the lower electrode 21. The adhesion layer may be formed with any material of Ti and NiCr, for example.

Figure 8:
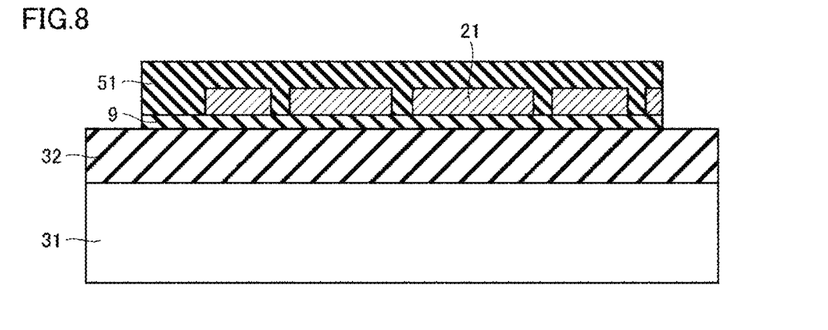
FIG. 8 is an explanation diagram of a fourth step in the method for manufacturing the piezoelectric device according to the second preferred embodiment of the present invention.

The piezoelectric layer 51 is formed and patterned in a desired shape as illustrated in FIG. 8. This patterning may be performed such that a resist pattern is formed by photolithography and RIE is performed, for example. The piezoelectric layer 51 may be formed with any material of AlN, ZnO, and PZT, for example.

Figure 9:
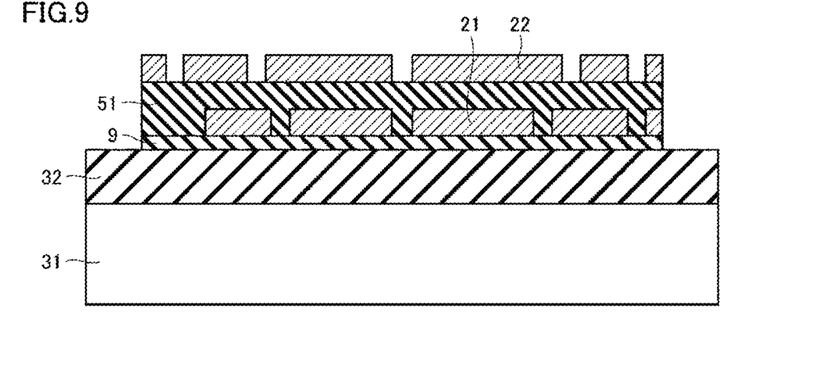
FIG. 9 is an explanation diagram of a fifth step in the method for manufacturing the piezoelectric device according to the second preferred embodiment of the present invention.

The intermediate electrode 22 is formed and patterned in a desired shape as illustrated in FIG. 9. This patterning may be performed such that a resist pattern is formed by photolithography and RIE is performed, for example. The intermediate electrode 22 can be formed with any material of Mo and W, for example. An adhesion layer may be formed in advance when forming the intermediate electrode 22. The adhesion layer may be formed with any material of Ti and NiCr, for example.

Figure 10:
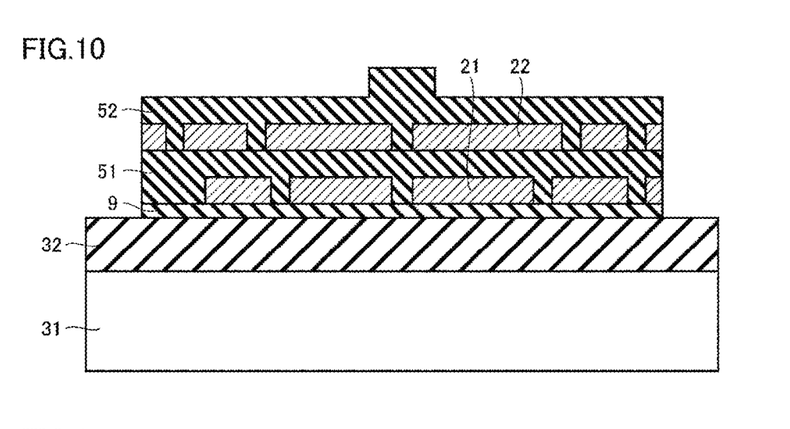
FIG. 10 is an explanation diagram of a sixth step in the method for manufacturing the piezoelectric device according to the second preferred embodiment of the present invention.

The piezoelectric layer 52 is formed and patterned in a desired shape as illustrated in FIG. 10. This patterning may be performed such that a resist pattern is formed by photolithography and RIE is performed, for example. The piezoelectric layer 52 may be formed with any material of AlN, ZnO, and PZT, for example.

Figure 11:
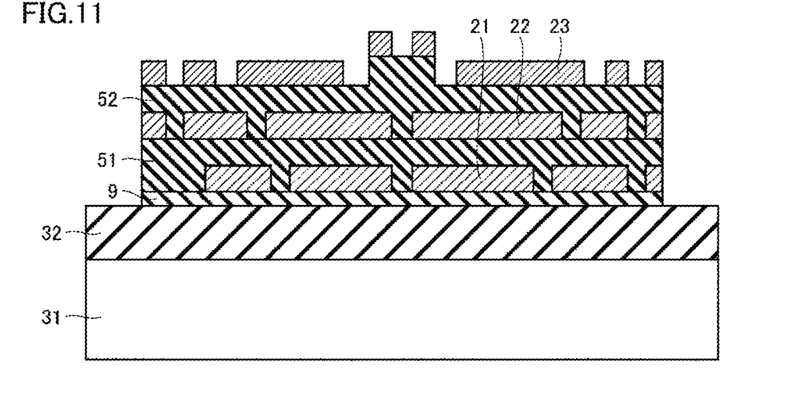
FIG. 11 is an explanation diagram of a seventh step in the method for manufacturing the piezoelectric device according to the second preferred embodiment of the present invention.

The upper electrode 23 is formed and patterned in a desired shape as illustrated in FIG. 11. This patterning may be performed such that a resist pattern is formed by photolithography and RIE is performed, for example. The upper electrode 23 can be formed with any material of Mo and W, for example. An adhesion layer may be formed in advance when forming the upper electrode 23. The adhesion layer may be formed with any material of Ti and NiCr, for example.

Figure 12:
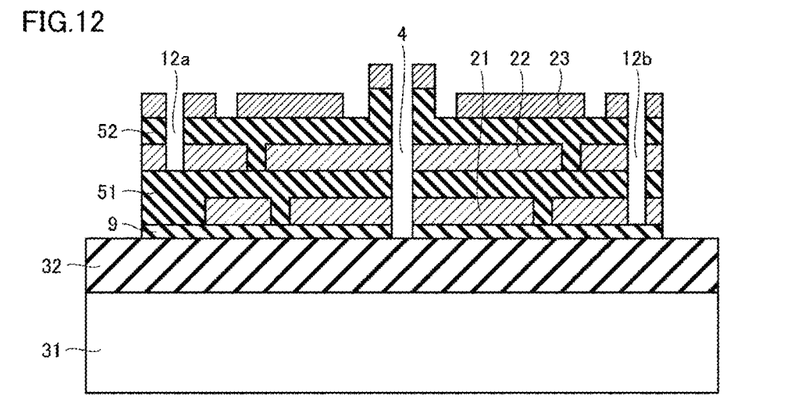
FIG. 12 is an explanation diagram of an eighth step in the method for manufacturing the piezoelectric device according to the second preferred embodiment of the present invention.

A groove 12a penetrating through the piezoelectric layer 52 and a groove 12b penetrating through the piezoelectric layers 51 and 52 are formed as illustrated in FIG. 12. The intermediate electrode 22 is exposed at the bottom portion of the groove 12a. The lower electrode 21 is exposed at the bottom portion of the groove 12b. Further, the slit 4 is formed as a groove extending the upper surface of the $SiO_2$ layer 32, in a region which is to become the membrane portion 3. These processes may be performed such that a resist pattern is formed by photolithography and RIE is performed, for example.

Figure 13:
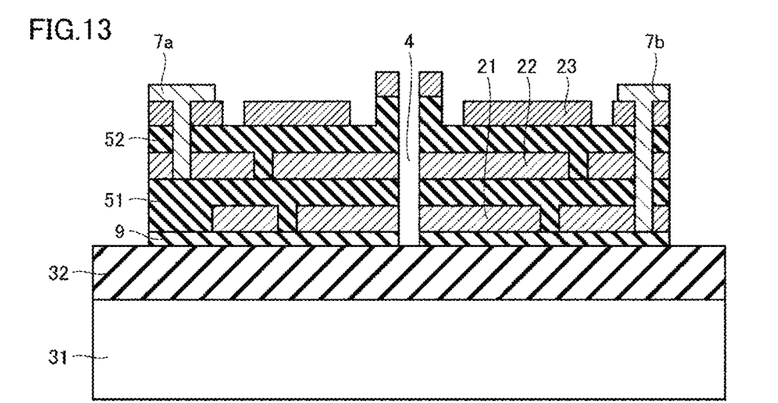
FIG. 13 is an explanation diagram of a ninth step in the method for manufacturing the piezoelectric device according to the second preferred embodiment of the present invention.

Wiring 7a and wiring 7b are formed as illustrated in FIG. 13. The wiring 7a is formed to fill the groove 12a. The wiring 7a establishes electrical connection to the intermediate electrode 22. The wiring 7b is formed to fill the groove 12b. The wiring 7b establishes electrical connection to the lower electrode 21. The wiring 7a and the wiring 7b can be formed with Al, for example. In order to form the wiring 7a and the wiring 7b in desired regions, a resist pattern may be formed by photolithography and the lift-off method may be applied, for example.

Figure 14:
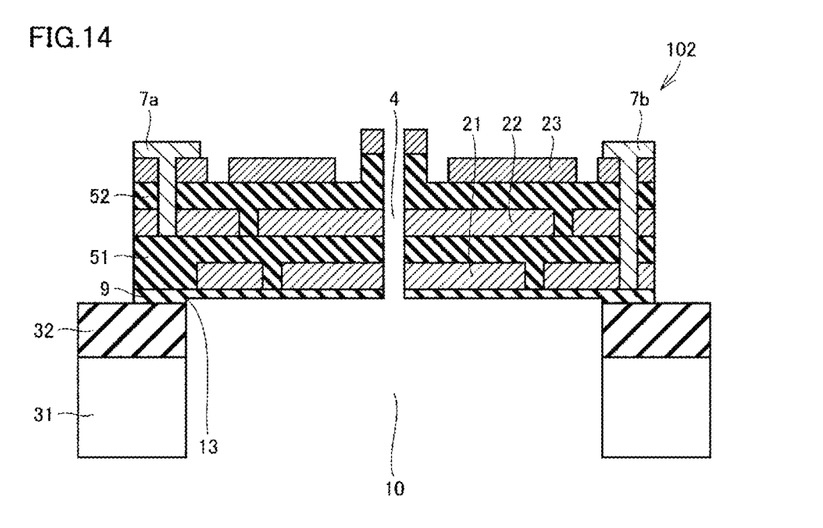
FIG. 14 is a sectional view of the piezoelectric device according to the second preferred embodiment of the present invention.

Si etching is performed from the Si layer 31 side, as illustrated in FIG. 14. A resist pattern may be formed by photolithography and RIE may be performed, for example. The Si etching is performed until an altered layer is over-etched. A concave portion 10 is obtained by the Si etching. The piezoelectric device 102 is thus obtained. In the piezoelectric device 102, the seed layer 9 is exposed as the lower surface of the membrane portion 3 and the bent portion 13 is formed on the seed layer 9.

First Modification of Piezoelectric Device

Figure 15:
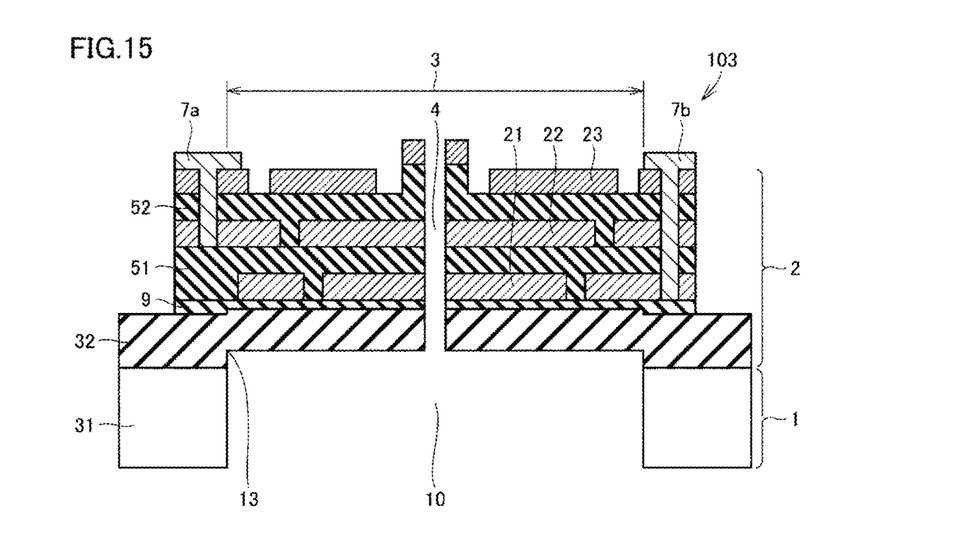
FIG. 15 is a sectional view of a piezoelectric device according to a first modification of the second preferred embodiment of the present invention.

A piezoelectric device 103 illustrated in FIG. 15 may be provided as a first modification of the piezoelectric device according to the present preferred embodiment. In the piezoelectric device 103, the $SiO_2$ layer 32 is exposed as the lower surface of the membrane portion 3 and the bent portion 13 is provided on the $SiO_2$ layer 32.

Second Modification of Piezoelectric Device

Figure 16:
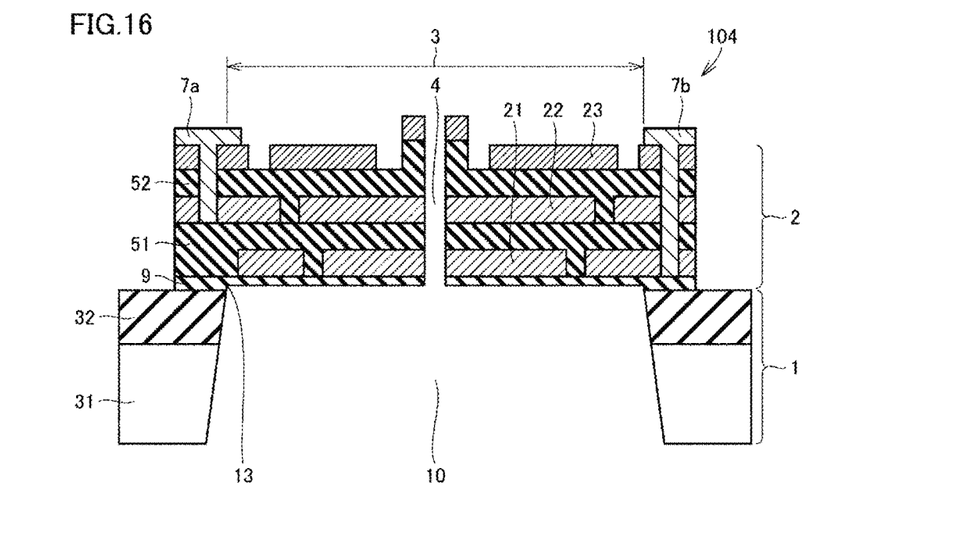
FIG. 16 is a sectional view of a piezoelectric device according to a second modification of the second preferred embodiment of the present invention.

A piezoelectric device 104 illustrated in FIG. 16 may be provided as a second modification of the piezoelectric device according to the present preferred embodiment. In the piezoelectric device 104, the seed layer 9 is exposed as the lower surface of the membrane portion 3 and the bent portion 13 is provided on the seed layer 9. In the piezoelectric device 104, a lateral wall that extends from the bent portion 13 is inclined. That is, the lateral wall that extends downward from the bent portion 13 is inclined in the seed layer 9. Further, a lateral wall of the $SiO_2$ layer 32 and a lateral wall of the Si layer 31 are similarly inclined in a continuous manner. The lateral walls of these layers are inclined at the same or substantially the same angles in FIG. 16, but the angles are not limitedly to being the same or substantially the same as each other. The inclination angles may be different from each other among the layers constituting lateral walls.

Third Preferred Embodiment

Structure

Figure 17:
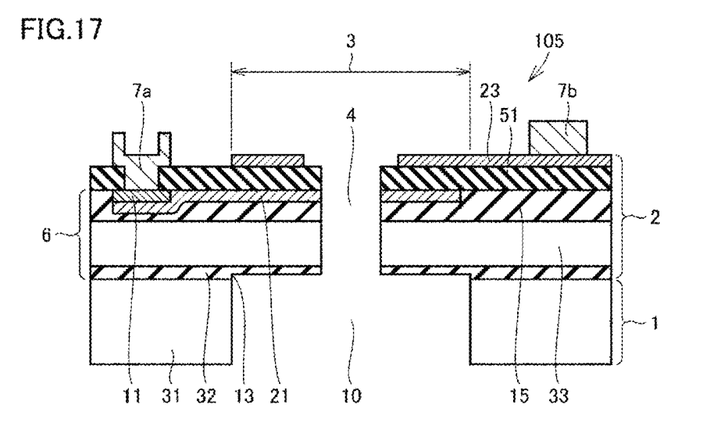
FIG. 17 is a sectional view of a piezoelectric device according to a third preferred embodiment of the present invention.

A piezoelectric device according to a third preferred embodiment of the present invention will be described with reference to FIG. 17. FIG. 17 is a sectional view of a piezoelectric device 105 according to the present preferred embodiment.

The piezoelectric device 105 includes the base portion 1 and the upper layer 2 on the upper side of the base portion 1 and is supported by the base portion 1. The upper layer 2 includes the membrane portion 3 that is a region which does not overlap with the base portion 1 in plan view. The membrane portion 3 includes at least one piezoelectric layer that is sandwiched by electrode layers from the top and the bottom thereof. In this example, a single piezoelectric layer 51 is provided as "at least one piezoelectric layer", as illustrated in FIG. 17. An intermediate layer 6 is provided between the "electrode layer on the lower side of the lowest piezoelectric layer among the at least one piezoelectric layer" and the base portion 1. As the number of piezoelectric layers is one in this example, "the lowest piezoelectric layer among the at least one piezoelectric layer" is the piezoelectric layer 51. The "electrode layer on the lower side of the piezoelectric layer 51" is the lower electrode 21. Namely, the intermediate layer 6 is provided between the lower electrode 21 and the base portion 1. The intermediate layer 6 includes one or more individual layers. The intermediate layer 6 includes a $SiO_2$ layer 15, a Si layer 33, and the $SiO_2$ layer 32. The "individual layer exposed as the lower surface of the membrane portion 3 among the one or more individual layers" is the $SiO_2$ layer 32. The $SiO_2$ layer 32 includes the bent portion 13 on a boundary between a portion defining and functioning as the lower surface of the membrane portion 3 and a portion overlapping with the base portion 1. The bent portion 13 extends from the lower surface of the membrane portion 3 to a lateral wall in the sectional view.

Advantageous Effects

The $SiO_2$ layer 32, which is the individual layer exposed as the lower surface of the membrane portion 3 among one or more individual layers of the intermediate layer 6, includes the bent portion 13 on the boundary between the portion defining and functioning as the lower surface of the membrane portion 3 and the portion overlapping with the base portion 1, in the present preferred embodiment. Accordingly, it can be said that an altered layer which originally existed on the lower surface of the individual layer is already removed, thus reducing or preventing an occurrence of problems which are caused by an altered layer. In the present preferred embodiment, an altered layer is already removed and accordingly, frequency variations among beams can be reduced or prevented. Consequently, characteristics of the piezoelectric device can be improved.

Manufacturing Method

A non-limiting example of a method for manufacturing the piezoelectric device 105 according to the present preferred embodiment will be described with reference to FIG. 18 to FIG. 24.

Figure 18:
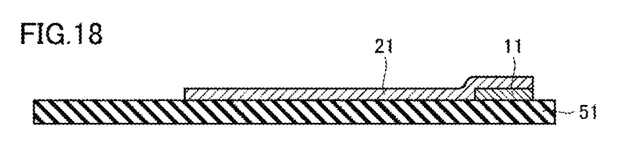
FIG. 18 is an explanation diagram of a first step in a method for manufacturing the piezoelectric device according to the third preferred embodiment of the present invention.

An etching stopper layer 11 is formed on the piezoelectric layer 51 and the lower electrode 21 is further formed, as illustrated in FIG. 18. The etching stopper layer 11 can be formed with Ni, for example. The lower electrode 21 can be formed with Pt, for example. Each of these is formed and then patterned in a desired shape, obtaining the state illustrated in FIG. 18. The etching stopper layer 11 is covered by the lower electrode 21. A portion of the lower electrode 21 overlaps with the etching stopper layer 11. The lower electrode 21 expands to a region which is later to be the membrane portion 3. An adhesion layer made of Ti or the like, for example, may be interposed between the piezoelectric layer 51 and the lower electrode 21.

Figure 19:
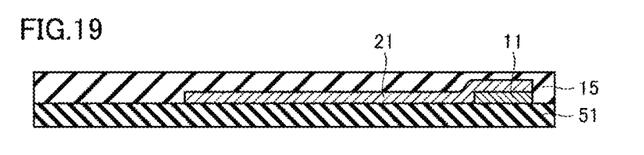
FIG. 19 is an explanation diagram of a second step in the method for manufacturing the piezoelectric device according to the third preferred embodiment of the present invention.

The $SiO_2$ layer 15 is formed as illustrated in FIG. 19. The $SiO_2$ layer 15 is formed to cover the lower electrode 21 and the etching stopper layer 11. In a state immediately after forming the $SiO_2$ layer 15, the upper surface of the $SiO_2$ layer 15 is not necessarily flat. A region, in which the lower electrode 21 is formed, of the upper surface of the $SiO_2$ layer 15 protrudes more than other region. Therefore, the upper surface of the $SiO_2$ layer 15 is planarized by a method such as CMP, for example. FIG. 19 illustrates a state after the planarization. Therefore, the upper surface of the $SiO_2$ layer 15 is already flat in FIG. 19.

Figure 20:
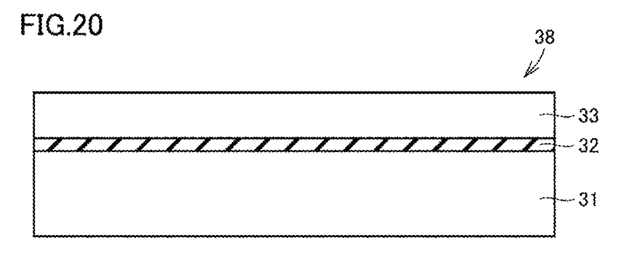
FIG. 20 is an explanation diagram of a third step in the method for manufacturing the piezoelectric device according to the third preferred embodiment of the present invention.

An SOI substrate 38 is separately prepared as illustrated in FIG. 20. The SOI substrate 38 includes the Si layer 31, the $SiO_2$ layer 32, and the Si layer 33. The $SiO_2$ layer 32 is sandwiched by the Si layer 31 and the Si layer 33.

Figure 21:
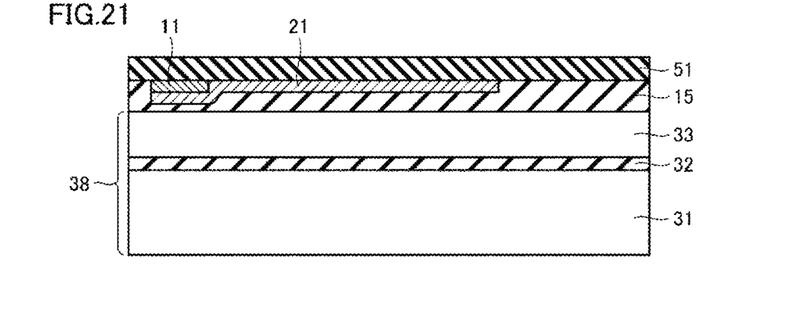
FIG. 21 is an explanation diagram of a fourth step in the method for manufacturing the piezoelectric device according to the third preferred embodiment of the present invention.

The structural body illustrated in FIG. 19 is bonded on the SOI substrate 38 illustrated in FIG. 20. This bonding is performed so that the upper surface of the $SiO_2$ layer 15 in FIG. 19 is in contact with the upper surface of the Si layer 33 in FIG. 20. In the bonding, there may be a conductor pattern on a joining surface. As a result of the bonding, the structural body illustrated in FIG. 21 is obtained. In FIG. 21, the structural body illustrated in FIG. 19 is turned upside down and bonded on the upper side of the SOI substrate 38 illustrated in FIG. 20. The piezoelectric layer 51 is exposed on the uppermost surface of the structural body. Polishing or the like is applied to the upper surface of the piezoelectric layer 51 to obtain the desired thickness of the whole piezoelectric layer 51. A method such as grinding and CMP, for example, may be used as the "polishing or the like". The piezoelectric layer 51 may be thinned such that ions are preliminarily implanted into the piezoelectric layer 51 to form a defect layer at a desired depth, then a surface layer portion peeled off from the defect layer as a boundary, and polishing is performed.

Figure 22:
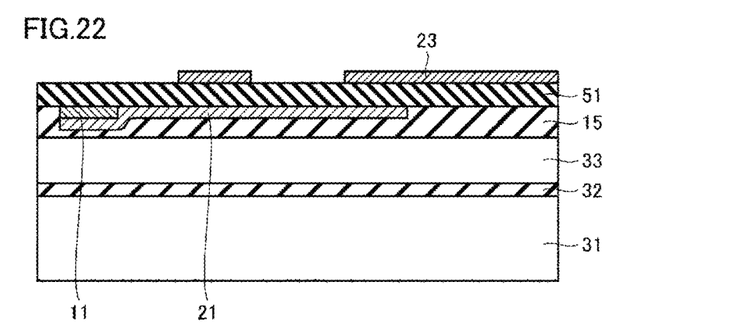
FIG. 22 is an explanation diagram of a fifth step in the method for manufacturing the piezoelectric device according to the third preferred embodiment of the present invention.

The upper electrode 23 is formed on the upper surface of the piezoelectric layer 51 as illustrated in FIG. 22. The upper electrode 23 can be formed with Pt, for example. The upper electrode 23 illustrated in FIG. 22 can be obtained by forming a Pt film and pattering the Pt film in a desired shape. An adhesion layer made of Ti or the like may be interposed between the piezoelectric layer 51 and the upper electrode 23.

Figure 23:
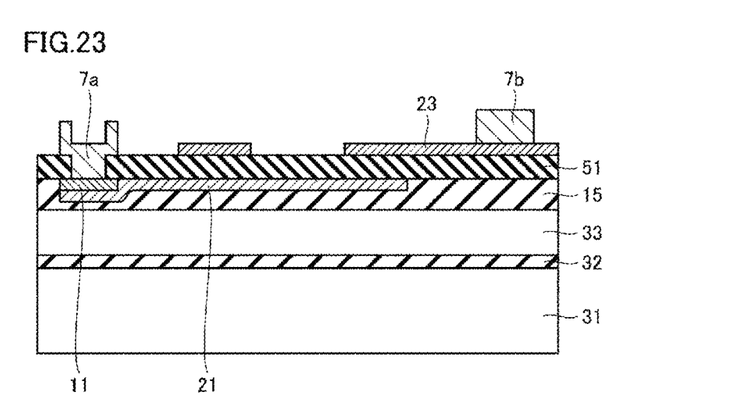
FIG. 23 is an explanation diagram of a sixth step in the method for manufacturing the piezoelectric device according to the third preferred embodiment of the present invention.

The piezoelectric layer 51 is etched to expose the lower electrode 21 as illustrated in FIG. 23. More precisely, a concave portion is formed by etching and the etching stopper layer 11 is exposed on the bottom of the concave portion. The wiring 7a is formed to fill this concave portion. The wiring 7a is electrically connected with the lower electrode 21 via the etching stopper layer 11. The wiring 7b is formed so as to be electrically connected with the upper electrode 23.

Figure 24:
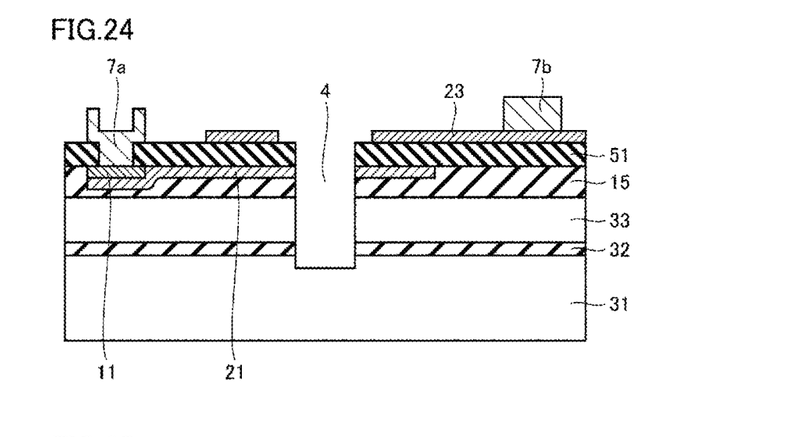
FIG. 24 is an explanation diagram of a seventh step in the method for manufacturing the piezoelectric device according to the third preferred embodiment of the present invention.

A resist pattern having an appropriate shape is formed on the upper surface and the slit 4 is formed as illustrated in FIG. 24 by a method such as dry etching, for example. The slit 4 is formed to have an X shape, for example, as illustrated in FIG. 1 and FIG. 2.

A resist pattern having an appropriate shape is formed on the lower surface of the Si layer 31 and etching is performed to the depth reaching the $SiO_2$ layer 32 by the Bosch process or the like, for example. As an etching rate of a $SiO_2$ layer is generally smaller than an etching rate of a Si layer under the conditions of the Bosch process, the $SiO_2$ layer 32 defines and functions as an etching stopper layer. The concave portion 10 is thus formed as illustrated in FIG. 17 and the piezoelectric device 105 is obtained. In addition, an altered layer is removed and the film thickness of the $SiO_2$ layer 32 is adjusted by dry etching or the like, obtaining the piezoelectric device 105 utilizing bending vibration. The piezoelectric device 105 thus obtained can provide the same or similar advantageous effects to those described in the first preferred embodiment.

Here, at least one layer among the one or more individual layers is preferably mainly made of silicon oxide, for example. This structure can more securely protect the lower electrode 21.

The membrane portion 3 preferably has the structure utilizing bending vibration. When this structure is provided, piezoelectric displacement causes stress concentration. However, interfacial peeling is less likely to occur because of the above-described structure and accordingly, the advantageous effects described in the first preferred embodiment can be more effectively achieved.

Fourth Preferred Embodiment

Structure

Figure 25:
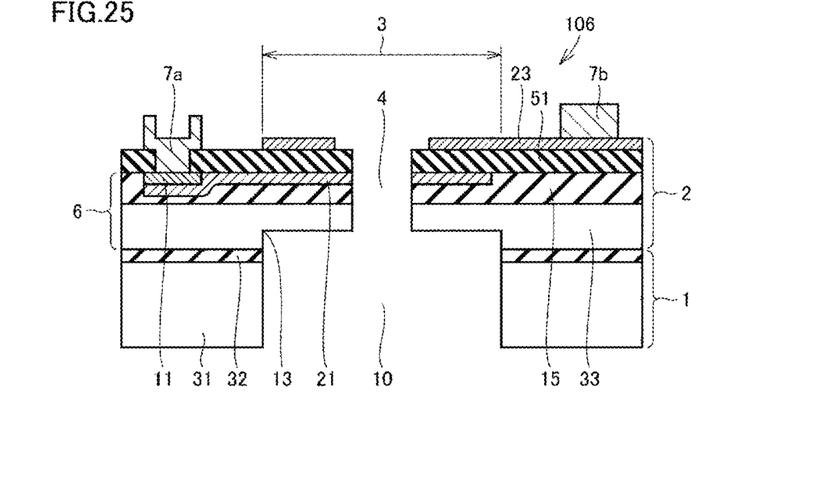
FIG. 25 is a sectional view of a piezoelectric device according to a fourth preferred embodiment of the present invention.

A piezoelectric device according to a fourth preferred embodiment of the present invention will be described with reference to FIG. 25. FIG. 25 is a sectional view of a piezoelectric device 106 according to the present preferred embodiment.

The piezoelectric device 106 includes the base portion 1 and the upper layer 2 that is on the upper side of the base portion 1 and is supported by the base portion 1. The upper layer 2 includes the membrane portion 3 that is a region which does not overlap with the base portion 1 in plan view. The membrane portion 3 includes at least one piezoelectric layer that is sandwiched by electrode layers from the top and the bottom thereof. In this example, the single piezoelectric layer 51 is provided as "at least one piezoelectric layer", as illustrated in FIG. 25. The intermediate layer 6 is provided between the "electrode layer on the lower side of the lowest piezoelectric layer among the at least one piezoelectric layer" and the base portion 1. The intermediate layer 6 includes one or more individual layers. The intermediate layer 6 includes the $SiO_2$ layer 15 and the Si layer 33, for example. The "individual layer exposed as the lower surface of the membrane portion 3 among the one or more individual layers" is the Si layer 33. The Si layer 33 includes the bent portion 13 on a boundary between a portion serving as the lower surface of the membrane portion 3 and a portion overlapping with the base portion 1. The bent portion 13 extends from the lower surface of the membrane portion 3 to a lateral wall in the sectional view.

Advantageous Effects

The Si layer 33, which is the individual layer exposed as the lower surface of the membrane portion 3 among one or more individual layers of the intermediate layer 6, includes the bent portion 13, which extends from the lower surface of the membrane portion 3 to the lateral wall in the sectional view, on the boundary between the portion defining and functioning as the lower surface of the membrane portion 3 and the portion overlapping with the base portion 1, in the present preferred embodiment. Accordingly, it can be said that an altered layer which originally existed on the lower surface of this individual layer is already removed, thus reducing frequency variations among beams. Thus, an occurrence of problems caused by an altered layer can be reduced or prevented and characteristics of the piezoelectric device can be improved.

Here, a plurality of above-described preferred embodiments may be included in an appropriately combined manner.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising:
a base portion; and
an upper layer on an upper side of the base portion and supported by the base portion;
wherein
the upper layer includes a membrane portion that does not overlap with the base portion in plan view;
the membrane portion includes at least one piezoelectric layer sandwiched by electrode layers from a top and a bottom thereof;
the at least one piezoelectric layer of the membrane portion is configured to utilize a bending vibration;
an intermediate layer is between one of the electrode layers and the base portion, the one of the electrode layers being provided on a lower side of a lowest piezoelectric layer among the at least one piezoelectric layer; and
the intermediate layer includes one or more individual layers, and an individual layer exposed as a lower surface of the membrane portion among the one or more individual layers includes a bent portion, the bent portion extending from the lower surface of the membrane portion to a lateral wall in a sectional view, on a boundary between a portion defining and functioning as the lower surface of the membrane portion and a portion overlapping with the base portion.

2. The piezoelectric device according to claim 1, wherein the lateral wall is inclined.

3. The piezoelectric device according to claim 1, wherein at least one layer among the one or more individual layers is mainly made of silicon oxide.

4. The piezoelectric device according to claim 1, wherein the intermediate layer exposed as a lower surface of the membrane portion among the one or more individual layers is a seed layer.

5. The piezoelectric device according to claim 1, wherein the intermediate layer includes a single layer which is a seed layer.

6. The piezoelectric device according to claim 5, wherein the seed layer includes at least one of AlN, ZnO, and PZT.

7. The piezoelectric device according to claim 1, wherein the membrane portion is divided into a plurality of regions by a slit.

8. The piezoelectric device according to claim 7, wherein the slit has an X shape.

9. The piezoelectric device according to claim 1, wherein the intermediate layer includes a first $SiO_2$ layer, a Si layer, and a second $SiO_2$ layer.

10. The piezoelectric device according to claim 9, wherein the second $SiO_2$ layer includes the bent portion.

11. The piezoelectric device according to claim 1, wherein the one of the electrode layers being provided on a lower side of a lowest piezoelectric layer among the at least one piezoelectric layer includes Mo or W.

12. The piezoelectric device according to claim 1, wherein the intermediate layer includes a $SiO_2$ layer and a Si layer.

13. The piezoelectric device according to claim 12, wherein the Si layer includes the bent portion.

14. A piezoelectric device comprising:
a base portion; and
an upper layer on an upper side of the base portion and supported by the base portion;
wherein
the upper layer includes a membrane portion that does not overlap with the base portion in plan view;
the membrane portion includes at least one piezoelectric layer sandwiched by electrode layers from a top and a bottom thereof;
an intermediate layer is between one of the electrode layers and the base portion, the one of the electrode layers being provided on a lower side of a lowest piezoelectric layer among the at least one piezoelectric layer;

the intermediate layer includes at least three individual layers, and an individual layer exposed as a lower surface of the membrane portion among the at least three individual layers includes a bent portion, the bent portion extending from the lower surface of the membrane portion to a lateral wall in a sectional view, on a boundary between a portion defining and functioning as the lower surface of the membrane portion and a portion overlapping with the base portion; and the intermediate layer includes a first $SiO_2$ layer, a Si layer, and a second $SiO_2$ layer.

15. A piezoelectric device comprising:

a base portion; and an upper layer on an upper side of the base portion and supported by the base portion;

wherein the upper layer includes a membrane portion that does not overlap with the base portion in plan view;

the membrane portion includes at least one piezoelectric layer sandwiched by electrode layers from a top and a bottom thereof;

an intermediate layer is between one of the electrode layers and the base portion, the one of the electrode layers being provided on a lower side of a lowest piezoelectric layer among the at least one piezoelectric layer;

the intermediate layer includes at least two individual layers, and an individual layer exposed as a lower surface of the membrane portion among the at least two individual layers includes a bent portion, the bent portion extending from the lower surface of the membrane portion to a lateral wall in a sectional view, on a boundary between a portion defining and functioning as the lower surface of the membrane portion and a portion overlapping with the base portion; and the intermediate layer includes a $SiO_2$ layer and a Si layer.

* * * * *